(12) United States Patent
Tai et al.

(10) Patent No.: US 8,053,315 B2
(45) Date of Patent: Nov. 8, 2011

(54) METHOD TO MANUFACTURE SPLIT GATE WITH HIGH DENSITY PLASMA OXIDE LAYER AS INTER-POLYSILICON INSULATION LAYER

(75) Inventors: Sung-Shan Tai, San Jose, CA (US);
Yong-Zhong Hu, Cupertino, CA (US);
François Hébert, San Mateo, CA (US);
Hong Chang, Cupertino, CA (US);
Mengyu Pan, Shanghai (CN); Yingying Lou, Shanghai (CN); Yu Wang, Fremont, CA (US)

(73) Assignee: Alpha & Omega Semiconductor, LTD (BM)

( * ) Notice: Subject to any disclaimer, the term of this patent is extended or adjusted under 35 U.S.C. 154(b) by 0 days.

(21) Appl. No.: 12/589,045

(22) Filed: Oct. 16, 2009

(65) Prior Publication Data

US 2010/0099230 A1 Apr. 22, 2010

Related U.S. Application Data

(62) Division of application No. 11/644,344, filed on Dec. 22, 2006, now abandoned.

(51) Int. Cl.
*H01L 21/336* (2006.01)
(52) U.S. Cl. ............ 438/270; 257/E21.41; 257/E21.419
(58) Field of Classification Search .................. 438/270; 257/E21.41, E21.419
See application file for complete search history.

(56) References Cited

U.S. PATENT DOCUMENTS

| 6,787,409 | B2 | 9/2004 | Ji et al. | |
| 2005/0145934 | A1* | 7/2005 | Kocon et al. | 257/333 |
| 2005/0167742 | A1 | 8/2005 | Challa et al. | |
| 2006/0246666 | A1* | 11/2006 | Han et al. | 438/263 |
| 2010/0148300 | A1* | 6/2010 | Zhou | 257/506 |

* cited by examiner

*Primary Examiner* — David S Blum
(74) *Attorney, Agent, or Firm* — Bo-In Lin

(57) ABSTRACT

This invention discloses a method of manufacturing a trenched semiconductor power device with split gate filling a trench opened in a semiconductor substrate wherein the split gate is separated by an inter-poly insulation layer disposed between a top and a bottom gate segments. The method further includes a step of forming the inter-poly layer by applying a RTP process after a HDP oxide deposition process to bring an etch rate of the HDP oxide layer close to an etch rate of a thermal oxide.

10 Claims, 7 Drawing Sheets

METHOD TO MANUFACTURE SPLIT GATE WITH HIGH DENSITY PLASMA OXIDE LAYER AS INTER-POLYSILICON INSULATION LAYER

This Patent Application is a Divisional Application and claims the Priority Date of a co-pending application Ser. 11/644,344 filed on Dec. 22, 2006 now abandoned by common Inventors of this Application. The Disclosures made in the patent application Ser. No. 11/644,344 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the split trench gates with high-density plasma (HDP) deposition oxide layer as the inter-poly oxide layer.

2. Description of the Prior Art

Conventional technologies for reducing the gate to drain capacitance Cgd in a DMOS device by employing the split trenched-gate, e.g., shielded gate trench (SGT) structure, are still confronted with technical limitations and difficulties. Specifically, trenched DMOS devices are configured with trenched gates wherein large capacitance (Cgd) between gate and drain limits the device switching speed. The capacitance is mainly generated from the electrical field coupling between the bottom of the trenched gate and the drain. In order to reduce the gate to drain capacitance, an improved split trenched-gate configuration, e.g., a Shielded Gate Trench structure (SGT), is introduced with a bottom shielding electrode at the bottom of the trenched gate to shield the trenched gates from the drain. The design concept of a SGT structure is link the bottom-shielding electrode of the trench to the source such that the trenched gates are shielded from the drain located at the bottom of the substrate as that shown in FIG. 1. A reduction of gate to drain capacitance to about half of the original Cgd value can be achieved by implementing the shielding electrode in the bottom of the trenched gates. The switching speed and switching efficiency of the DMOS devices implemented with the SGT structure are therefore greatly improved. The bottom-shielding electrode when tied to source potential provides a better shielding effect than a configuration where the bottom-shielding segment is left at a floating potential. A reduction of the gate-drain capacitance Cgd is achieved by implementing a bottom poly shielding structure. The problem of break down from trench bottom is eliminated since bottom oxide has a greater thickness than the layer gate oxide along the trench sidewalls. The net effect is an advantage that for a specific epitaxial thickness, such SGT structure can deliver much higher drain-to-source breakdown voltage (BVdss). Once the BVdss is not a limiting design consideration, the designer has the flexibilities to either increase the doping level or reduce thickness of the epitaxial layer, or to design a device that may accomplish both in order to improve the overall device performance.

However, as shown in FIG. 1, in the manufacturing process, a step of carrying out a wet etch of the first gate oxide often causes a problem of gate oxide weakness. The oxide etch often extends below the top surface of the first polysilicon that have been first deposited into the bottom part of the trench thus causing the formation of an over-etching pocket. Specifically, the sharp and thin inter-poly oxide causes early breakdown between source and gate due to the problems that 1) the dip leads to electric file concentration in the area that causes premature breakdown; and 2) the dip increases a gate-drain overlay thus the Cgd improvement is compromised. Such technical difficulties become a problem when the conventional processes are applied. When applying a conventional manufacturing process, a wet etch process is applied to remove the sidewall oxide that is damaged during first polysilicon etch-back. The isotropic wet-etch process inevitably etches off a portion of sidewall oxide slightly below the top surface of poly creating a pocket on the sidewall. A thermal oxide is grown conformal to the underlying layer forming the upper trench sidewall gate oxide and inter-poly gate oxide followed by second poly deposition. This technical problem and performance limitation often become even more severe when the cell density is increased due to the shrinking dimension of the trench openings when form the trenched power device in the semiconductor substrate.

Therefore, a need still exists in the art of power semiconductor device design and manufacture to provide new manufacturing method and device configuration in forming the power devices such that the above discussed problems and limitations can he resolved.

SUMMARY OF THE PRESENT INVENTION

It is therefore an object of the present invention to provide a new and improved semiconductor power device implemented with the split trenched gates where the inter-poly insulation layer is formed with a HDP deposition process with improved planar surface characteristics followed by annealing process in order to overcome the above discussed technical difficulties and limitations.

Specifically, it is an object of the present invention to provide improved device configuration and manufacturing method to reduce the gate to drain capacitance while accurately control the thickness of the inter-poly layer by depositing a HDP oxide insulation layer on top of the bottom trench polysilicon then applied a controlled etch to accurately etch off a desired layer thickness of the inter-poly insulation such that the depth above the bottom trench poly can be better controlled. With this new structure and the method to fine-tune the inter-poly oxide thickness between the $2^{nd}$ oxide separately, the split trench gate may be formed without compromising the integrity of gate oxide Briefly in a preferred embodiment this invention discloses a trenched metal oxide semiconductor field effect transistor (MOSFET) cell. The trenched MOSFET cell includes a trenched gate opened from a top surface of the semiconductor substrate surrounded by a source region encompassed in a body region above a drain region disposed on a bottom surface of a substrate. The trenched gate further includes at least two mutually insulated trench-filling segments with an inter-segment insulation layer that is specially deposited to provide better planar surface characteristics and with controllable inter-segment thickness whereby trench integrity is improved. In a preferred embodiment, the inter-segment insulation is a HDP deposition layer provided with surface planar characteristics for preventing over-etching through the inter-poly layer.

This invention further discloses a method for manufacturing a trenched metal oxide semiconductor field effect transistor (MOSFET) cell on a semiconductor substrate with split gate separated by an inter-poly insulation layer separating a top and a bottom gate segments. The method further includes steps of applying a RTP process after a HDP oxide deposition process to bring an etch rate of the HDP oxide layer close to an etch rate of a thermal oxide.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
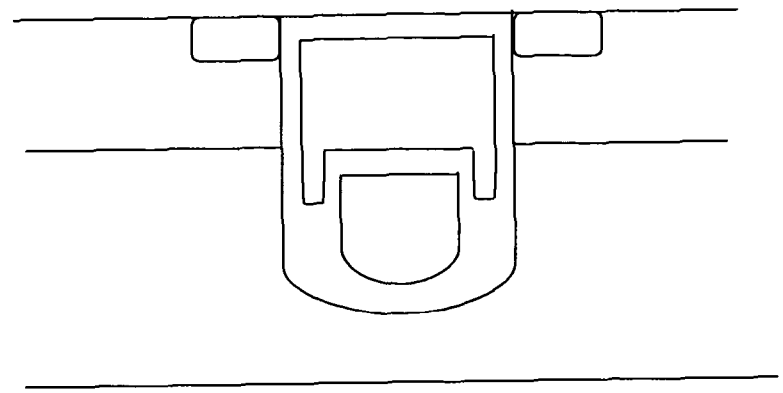
FIG. 1 is a cross sectional view of a conventional trenched MOSFET device implemented with a trenched gate configured with a conventional split trenched gate trench configuration that shows the uneven etched inter-poly layer.
Figure 2:
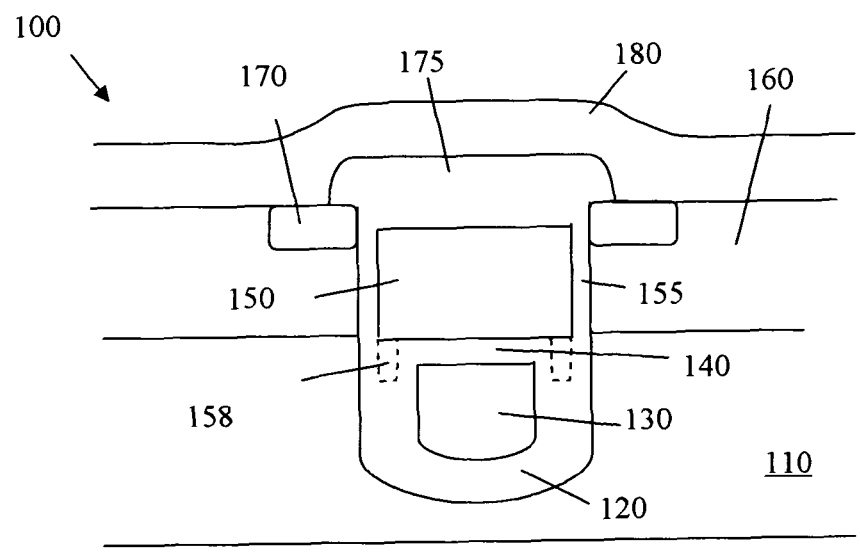
FIG. 2 is a cross sectional view of a trenched MOSFET device implemented with split trenched gate with improved inter-poly insulation layer providing improved planar surface characteristics and thicker trench bottom oxide layer of this invention.

Referring to FIG. 2 for a cross sectional view of a trenched MOSFET device 100 of this invention. The trenched MOSFET device 100 is supported on a substrate 105 formed with an epitaxial layer 110. The trenched MOSFET device 100 includes a bottom gate segment 130 filled with polysilicon at the bottom portion below a top trenched gate segment 150. The bottom gate segment 130 filled with the polysilicon is shielded and insulated from a top gate segment 150 by an insulation inter-poly layer 140 disposed between the top and bottom segments. The bottom trenched-segment is also insulated from the drain disposed below 105 by the insulation layers 120 surrounding the bottom surface of the trenched gate. The top trenched gate segment 150 is also filled with a polysilicon layer in the top portion of the trench surrounded with a gate insulation layer 155 covering the trenched walls. The inter-poly insulation layer 140 is formed by HDP oxide deposition. The HDP deposition of the oxide layer provides a reasonable and sufficient planar top surface for the inter-poly insulation layer 140. Furthermore, the inter-poly oxide layer 140 is annealed at a high temperature from 850 C to 1150 C from few minutes to hours followed by CMP and dry or wet etch to achieve a desired thickness above the bottom polysilicon electrode. Specifically, the problem generated from a dip of the inter-poly insulation layer 140 is now eliminated. The dip, i.e., a pocket 158 is now filled with HDP. The pocket is generated from an isotropic wet etch process that etches off a portion of the sidewall oxide slightly below the top surface of the polysilicon insulation layer 140 due to the fact that the sidewall oxide is damaged during the first polysilicon etchback process. Once the pocket 158 is now filled with the HDP, the difficulties of premature breakdown and Cgd compromise are therefore resolved.

A body region 160 that is doped with a dopant of second conductivity type, e.g., P-type dopant, extends between the trenched gates 150. The P-body regions 160 encompassing a source region 170 doped with the dopant of first conductivity, e.g., N+ dopant. The source regions 170 are formed near the top surface of the epitaxial layer surrounding the trenched gates 150. On the top surface of the semiconductor substrate are also insulation layers 175, contact openings and metal layers 180 for providing electrical contacts to the source-body regions and the gates. For the sake of brevity, these structural features are not shown in details and discussed since those of ordinary skill in the art already know these structures.

Figure 3A:
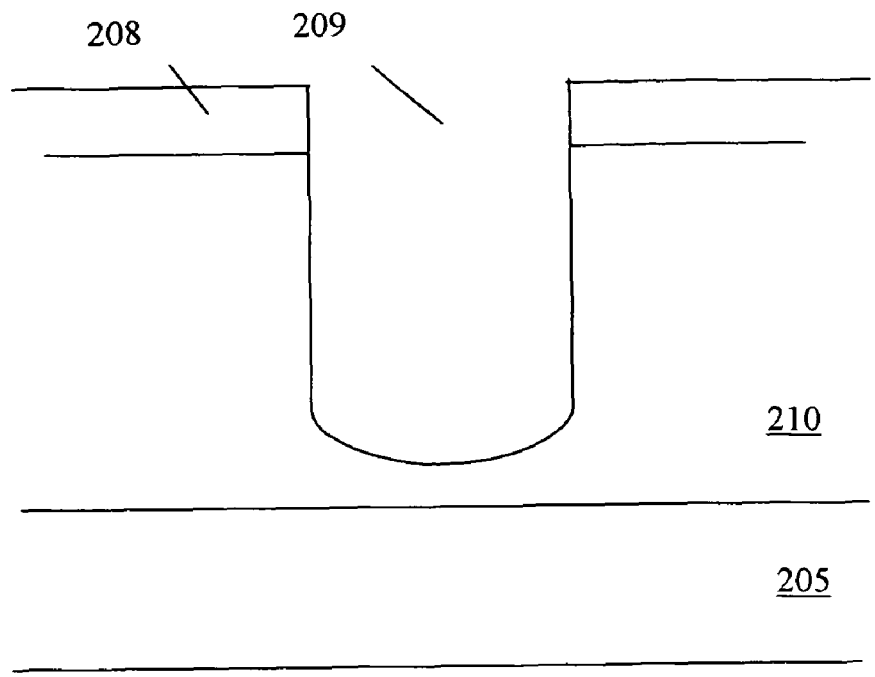
FIGS. 3A to 3J are a serial cross sectional views for describing the manufacturing processes to provide a trenched MOSFET device as shown in FIG. 2.
Figure 3B:
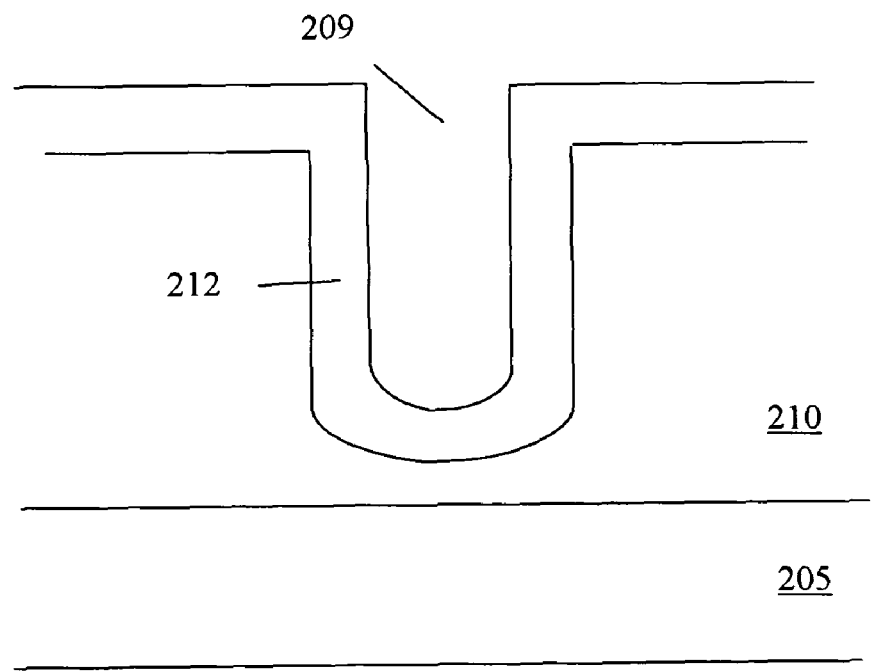
Figure 3C:
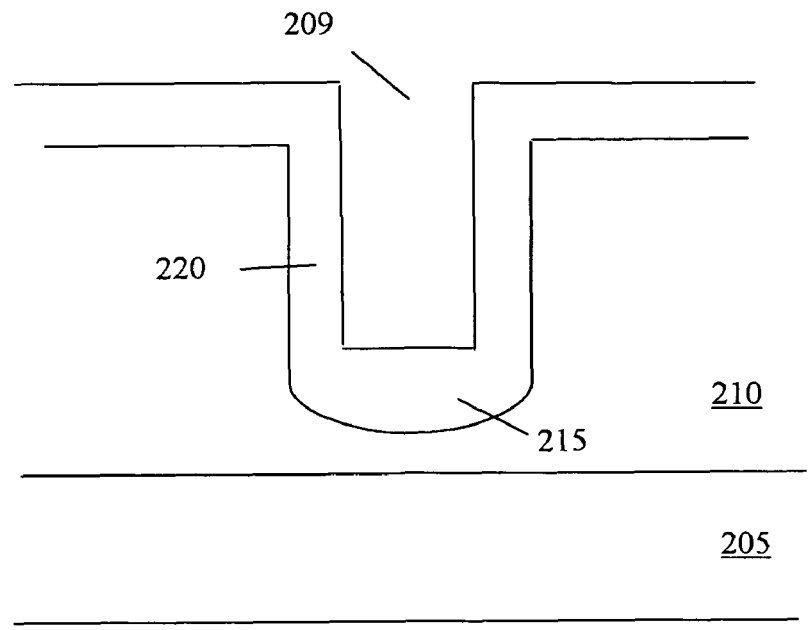

Referring to FIGS. 3A to 3L for a serial of side cross sectional views to illustrate the fabrication steps of a MOSFET device as that shown in FIG. 2. In FIG. 3A, a hard oxide mask 208 is applied to open a plurality of trenches 209 on an epitaxial layer 210 overlaying a substrate 205. In FIG. 3B, the hard oxide mask 208 is removed and an oxide layer 212 is grown by a thermal oxide process on the sidewall and bottom surface of the trench 209. The oxide layer 212 may be formed by an oxide deposition to improve the thinning situation at the bottom of the trench 209. To further increase the thickness of the bottom oxide, as shown in FIG. 3C, a thermal oxide layer is grown to form the bottom oxide layer then incorporated with a high density plasma (HDP) oxide deposition as an optional processing step. The oxide layer on the trench sidewall and on the top surface of the silicon substrate is removed in order to form a thicker bottom oxide layer 215, and then a gate oxide layer 220 is grown.

Figure 3D:
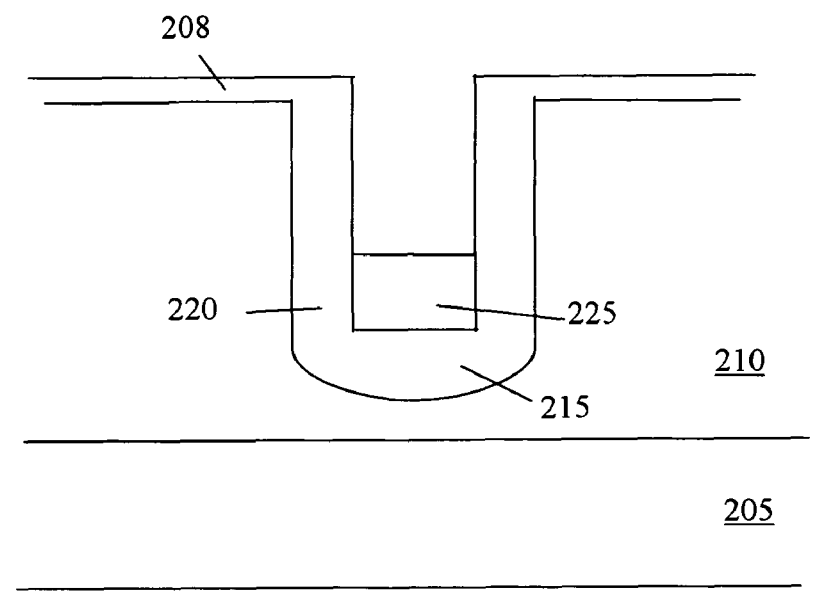
Figure 3E:
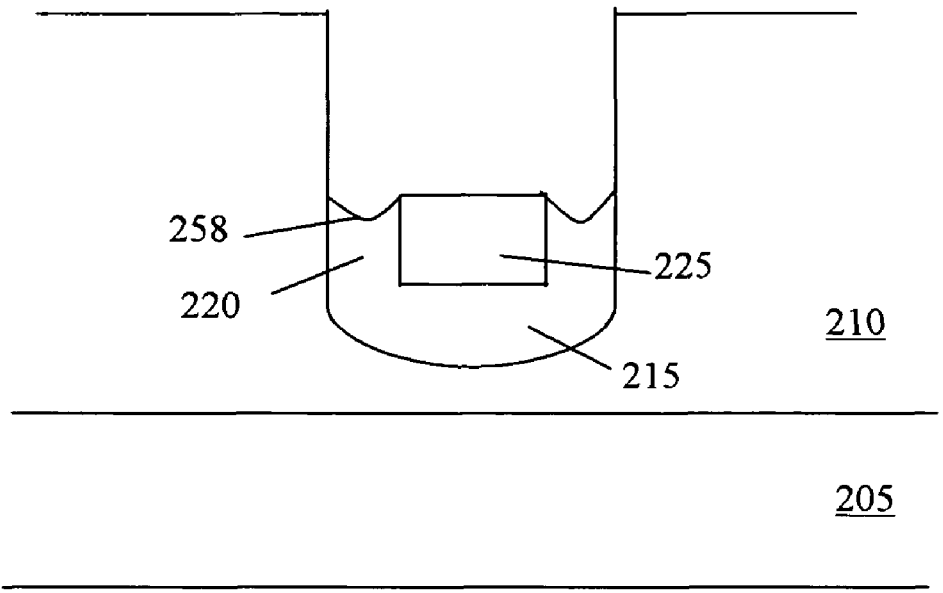
Figure 3F:
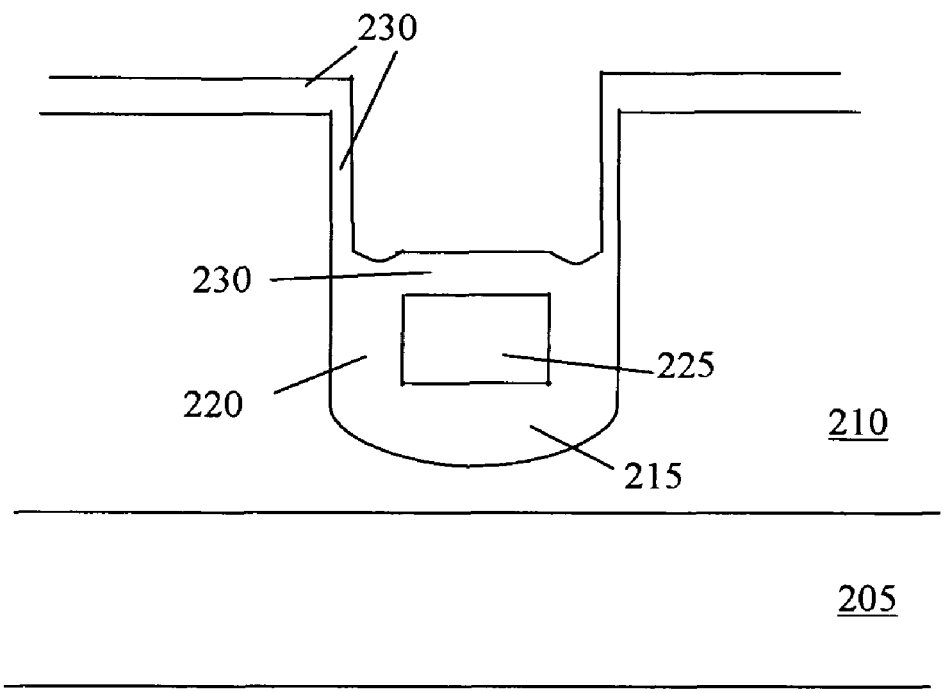
Figure 3E:
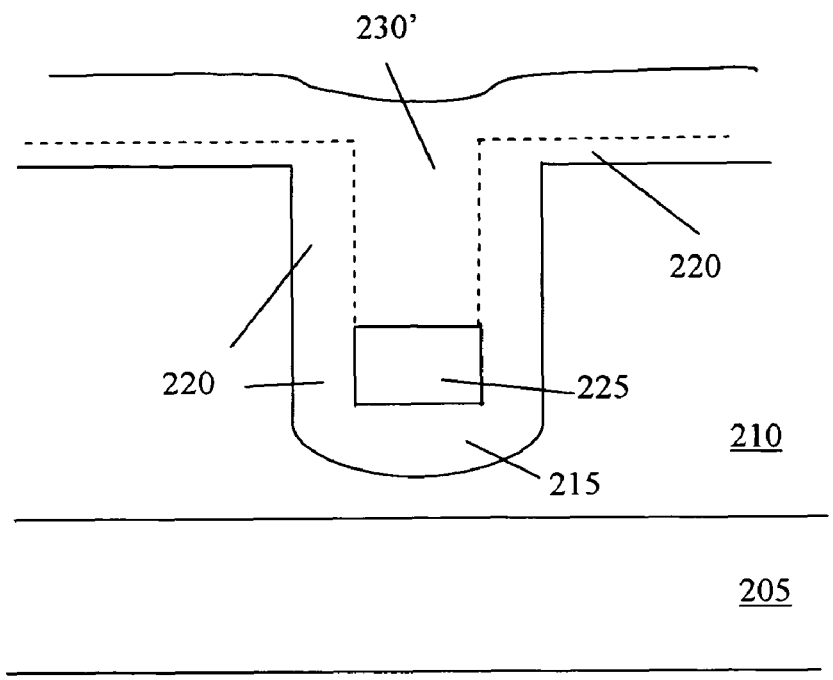
Figure 3F:
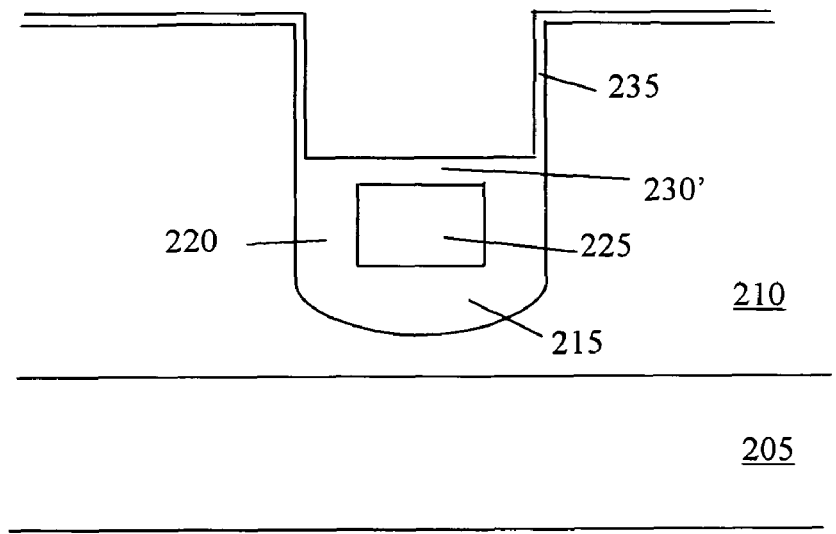

In FIG. 3D, a non-doped polysilicon 225 is deposited then doped with POCL3 followed by implanting phosphorus or boron ions. An annealing process is performed to the polysilicon layer that may be either N-type of P-type doped gate filling material. Alternatively, in-situ doped poly can be deposited to fill the trench. A polysilicon etch back is carried out to remove from the top portion of the polysilicon layer 225 until a desired depth is reached. The top hard mask oxide layer 208 is partially etched off during poly etch back process. In FIG. 3E, an oxide etch process is carried out to completely remove the hard mask layer 208 and the trench sidewall oxide layer 220 over the polysilicon layer 225 causing a dip 258 due to corner over etch as happening in prior art process. In FIG. 3F, a HDP oxide 230 is deposited to line the trench sidewall to form the trench gate oxide and the top surface of bottom poly 225 to form the inter poly oxide. During this process, the nature of HDP oxide deposition provides a thick horizontal oxide layer on the top surface of bottom poly layer 225 that substantially fill in the dip 258 providing a substantial planar inter poly oxide layer without compromising the breakdown. At the same time a thin vertical HDP oxide will form on the sidewall of trench above poly layer 225 to function as gate oxide. A RTP process may be applied to intensify the HDP oxide to improve the quality of oxide layer before continue the process of FIGS. 3G-3J as describe below.

A prefer embodiment to obtain a better improved inter poly layer oxide can be achieve through the process illustrated by FIGS. 3E' and 3F' right after the etch back of poly layer 225 of FIG. 3D. As shown in FIG. 3E', a HDP oxide 230 is deposited to fill the trench followed by a densification process at an elevated temperature in a N2 of O2/N2 ambient environment to carry out a wet oxidation. The condition of annealing is controlled so that the etch rate of HDP oxide 230 after annealing process is increased to be substantial the same as an etch rate of thermal oxide 220. In one embodiment, the annealing is carried out to achieve the HDP oxide densification by using N2 1150 C 30 sec RTP right after HDP inter-poly oxide deposition. Such RTP effect showed that Wet etch rate changed from 13 A/sec to 11.5 A/sec that is an 10% etch rate increase. Such effect is an indication of oxide densification. The densification process enhances the uniformity of the following wet etch process. In FIG. 3F', the HDP oxide 230' is dry etched back together with thermal oxide 220 to expose oxide on the top surface followed by a dry or wet-etch process to obtain a desired thickness of inter poly oxide layer 230. Alternatively a chemical-mechanical planarization (CMP) process may be first performed on top of the surface of the HDP oxide layer 230 to provide a planar surface then a dry or wet etch process is followed to obtain a desired thickness of the HDP oxide layer 230. The CMP process is optional to further improve the surface characteristics of the HDP surface. A unique inter-poly insulation layer with desired inter-poly layer profile characterized by a substantial planar surface is therefore achieved due to the etch rate of HDP oxide has been adjusted to substantially equal to the etch rate of thermal oxide through a precisely controlled RTP anneal process.

Figure 3G:
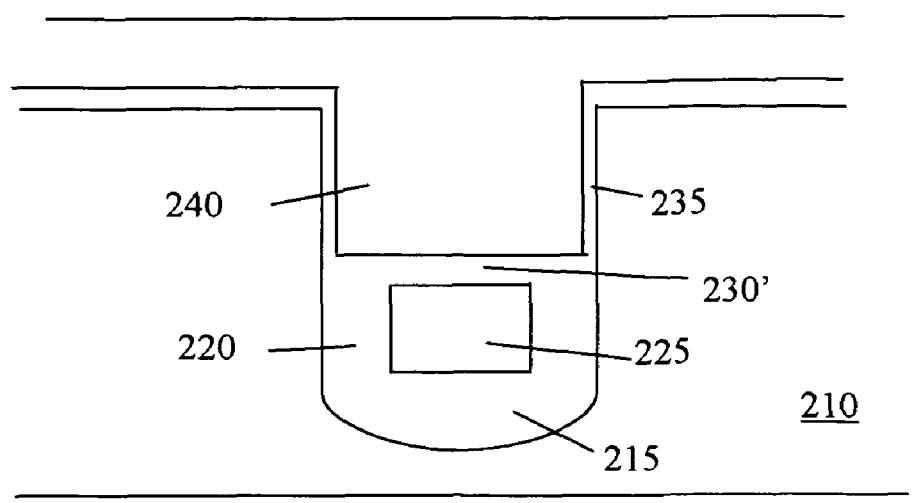
Figure 3H:
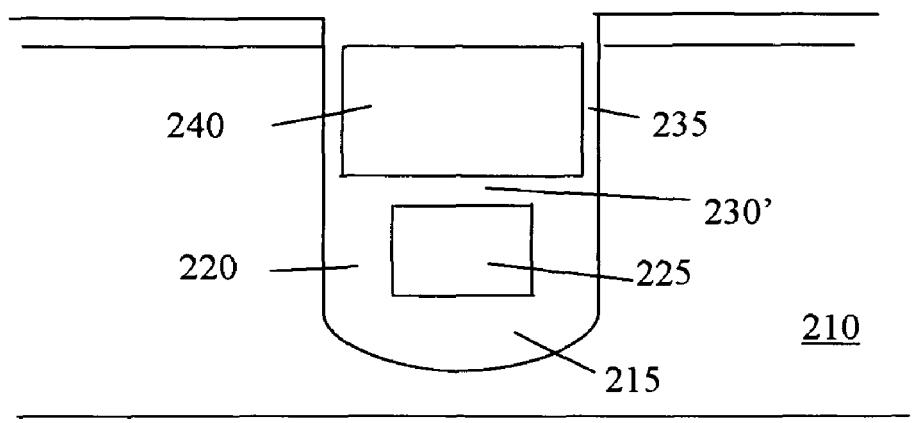
Figure 3I:
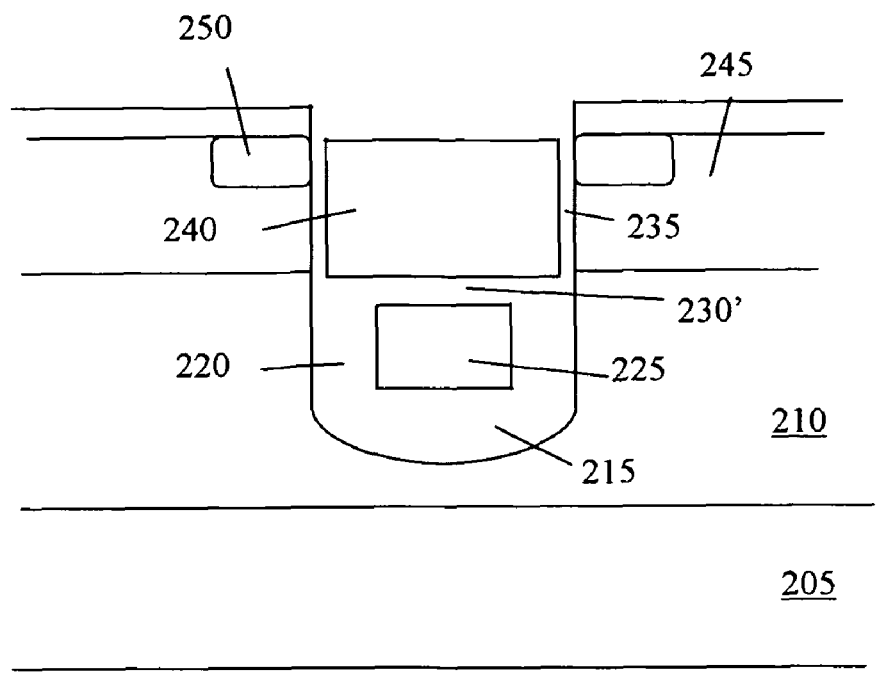
Figure 3J:
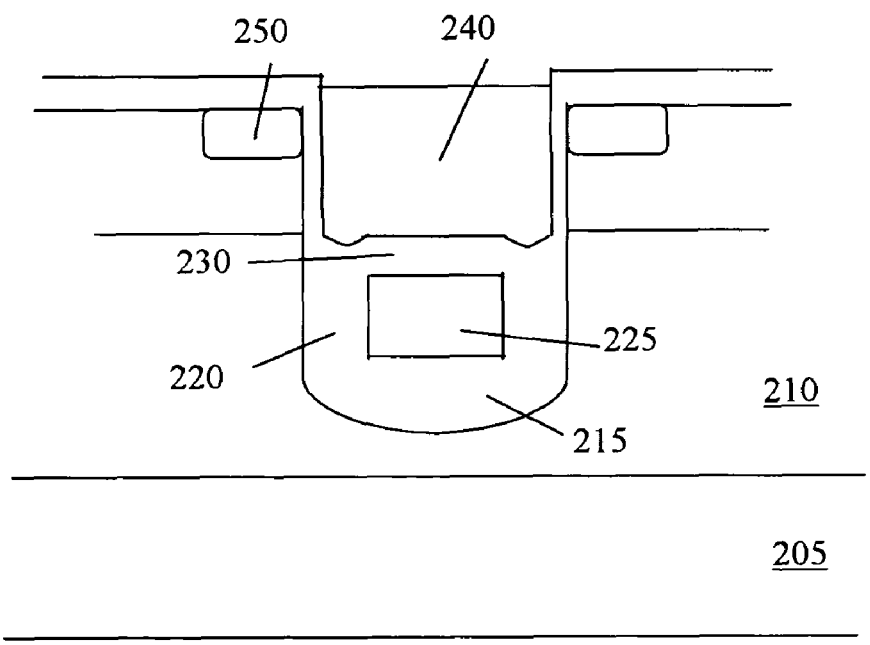

In FIG. 3G, a gate oxide layer 235 is first grown followed by in-situ polysilicon deposition to fill the trench with a polysilicon layer 240. In FIG. 3H, the polysilicon layer 240 is etched back from the top surface of the silicon substrate. In FIG. 3I, a body implant is performed followed by a body diffusion to form the body region 245. Then a source mask (not shown) is applied to carry out a source ion implant followed by a source diffusion to form the source regions 250. In the case when a thick oxide layer is remained or grown on top the semiconductor while the second gate poly is deposited and etch back during the process of FIGS. 3G and 3H, the top surface of the second gate poly may be controlled during etch back to a depth that is that is just below the thick oxide layer but higher than the top surface of silicon substrate resulting a device as shown in FIG. 3J with high poly gate guaranteeing overlap with the source region even the source is shallow. The remainder of the processes includes standard processing steps. The process is followed by the deposition of PSG or BPSG passivation layer over the top surface. Then a contact opening etch is carried out to open the source contact opening and gate contact opening (not shown) through the passivation layer after the passivation layer is panelized by high temperature flow. Then, a contact metal layer is deposited over the top surface followed by standard etch process to pattern the contact metal into source metal and gate pad (not shown). For the sake of clarity, these standard processes are not specifically described in details since these processes are well known among those of ordinary skill in the art.

The MOSFET device as described above thus provides a device structure and configuration where the inter-poly insulation has much improved and controllable thickness and surface profile. Specifically, the first gate electrode at the bottom surface has a thick trench bottom oxide. The inter-poly insulation formed by HDP oxide deposition have reasonable and sufficient planar top surface. Furthermore, the inter-poly oxide layer is annealed at a high temperature from 850 C to 1150 C from few minutes to hours followed by CMP and dry or wet etch to achieve a desired thickness above the bottom polysilicon electrode. The quality and performance of the trenched gates are significantly improved because the well controlled and improved planar characteristics of the inter-poly oxide layer. A well-controlled inter-poly uniformity and thickness thus improve the control capacitance and the breakdown between source and gate. Such process window control is one of the key parameter to determine the success of this new technology with the shielded gate structure for device performance improvements.

According to above descriptions, this invention further discloses a method for manufacturing a trenched semiconductor power device by opening a trench in a semiconductor substrate. The method further includes a step of filling the trench with a trenching filling material followed by an etch-back process to remove from a top portion of the trench until a desired depth is reached. The method further includes a step of depositing a high-density plasma (HDP) oxide layer followed by an annealing densification process at an elevated temperature for increasing an etch rate of the HDP oxide layer to be substantially the same as an etch rate of a thermal oxide. The step of annealing densification process further includes a step of carrying out the annealing densification process in a N2 of O2/N2 ambient environment to carry out a wet oxidation. In an exemplary embodiment, the step of annealing densification process further includes a precisely controlled RTP anneal process whereby the HDP oxide layer having substantially a same etch rate as an etch rate of a thermal oxide. In an exemplary embodiment, the method further includes a step of dry etching back the HDP oxide layer to expose the HDP oxide layer followed by a dry or wet-etch to obtain a desired HDP oxide layer thickness. In an exemplary embodiment, the method further includes a step of applying a chemical-mechanical planarization (CMP) process on the HDP oxide layer. In an exemplary embodiment, the step of filling the trench with a trench filling material further includes a step of filling the trench with an un-doped polysilicon then doping the polysilicon with POCL3 followed by implanting phosphorous or boron ions. In an exemplary embodiment, the step of etching back to remove the trench filling material from a top portion of the trench further forming an over-etching pocket along sidewalls of the trench near a top portion of a bottom portion of the trench-filling material. And, the step of depositing a high-density plasma (HDP) oxide layer further includes a step of filling the over-etching pocket for improving a device ruggedness of the semiconductor power device. In an exemplary embodiment, the method further includes a step of filling the trench on top of the inter-segment insulation layer to form at least two mutually insulated trench-filling segments constituting a split gate for the semiconductor device. In an exemplary embodiment, the method further includes a step of implanting a source region surrounding the split gate and impaling a body region encompassing the source region for manufacturing the semiconductor power device as a trenched metal oxide semiconductor field effect transistor (MOSFET) device.

This invention further discloses a method of for manufacturing a trenched semiconductor power device with split gate filling a trench opened in a semiconductor substrate wherein the split gate is separated by an inter-poly insulation layer separating a top and a bottom gate segments. The method further includes a step of forming the inter-poly layer by applying a RTP process after a HDP oxide deposition process to bring an etch rate of the HDP oxide layer close to an etch rate of a thermal oxide.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a trenched semiconductor power device comprising step of opening a trench in a semiconductor substrate and said method further comprising:

forming an oxide layer on sidewalls and a bottom surface of said trench followed by filling said trench with a trenching filling material followed by an etch back process to remove from a top portion of said trench until a desired depth is reached;

depositing a high density plasma (HDP) oxide layer into said trench filling a space above said trench filling material and surrounded by said oxide layer on said trench sidewalls followed by an annealing densification process in an N2 or O2/N2 ambient environment at an elevated temperature for increasing an etch rate of said HDP oxide layer to be substantially the same as an etch rate of the oxide layer surrounding the HDP oxide layer; and dry etching back said HDP oxide layer and partially etching the oxide layer on said trench sidewalls surrounding said HDP oxide layer to expose said HDP oxide layer followed by a dry or wet-etch to obtain a desired HDP oxide layer thickness and a desired oxide layer thickness of the oxide layer on said trench sidewalls.

2. The method of claim 1 wherein:

said step of carrying out said annealing densification process in said N2 of O2/N2 ambient environment further comprising a step of form the HDP layer by carrying out a wet oxidation in said N2 of O2/N2 ambient environment.

3. The method of claim 1 wherein:

said step of carrying out said annealing densification process in said N2 of O2/N2 ambient environment further comprising a step of carrying out said annealing densification process at a temperature above 850 degrees Celsius for approximately 30 seconds to carry out a RTP process.

4. The method of claim 1 wherein:

said step of carrying out said annealing densification process further comprising a precisely controlled RTP anneal process by using an N2 1150C 30 second RTP process whereby said HDP oxide layer having substantially a same etch rate as an etch rate of the oxide layer surrounding the HDP oxide layer.

5. The method of claim 4 further comprising:

applying a chemical-mechanical planarization (CMP) process on said HDP oxide layer.

6. The method of claim 1 wherein:

said step of etching back to remove said trench filling material from a top portion of said trench further forming an over-etching pocket near sidewalls of said trench on a top portion of a bottom portion of said trench-filling material; and said step of depositing a high density plasma (HDP) oxide layer further comprising a step of filling said over-etching pocket for improving a device ruggedness of said semiconductor power device.

7. The method of claim 1 further comprising:

filling said trench filling material into said trench on top of said HDP oxide layer functioning as an inter-segment insulation layer to form at least two mutually insulated trench-filling segments constituting a split gate for said semiconductor device.

8. The method of claim 7 further comprising:

implanting a source region surrounding said split gate and impaling a body region encompassing said source region for manufacturing said semiconductor power device as a trenched metal oxide semiconductor field effect transistor (MOSFET) device.

9. A method for manufacturing a trenched semiconductor power device comprising step of opening a trench in a semiconductor substrate and said method further comprising:

filling said trench with a trenching filling material followed by an etch back process to remove from a top portion of said trench until a desired depth is reached;

depositing a high density plasma (HDP) oxide layer followed by an annealing densification process at an elevated temperature for increasing an etch rate of said HDP oxide layer to be substantially the same as an etch rate of a thermal oxide; and wherein said step of filling said trench with a trench filling material further comprising a step of filling said trench with an un-doped polysilicon then doping said polysilicon with POCL3 followed by implanting phosphorous or boron ions.

10. A method for manufacturing a trenched semiconductor power device with split gate filling a trench opened in a semiconductor substrate wherein the split gate is separated by an inter-poly insulation layer separating a top and a bottom gate segments, the method further comprising:

forming an oxide layer on sidewalls and a bottom surface of said trench followed by filling said trench with a trenching filling material followed by an etch back process to remove from a top portion of said trench until a desired depth is reached;

forming said inter-poly layer by depositing a high density plasma (HDP) oxide layer into said trench filling a space above said trench filling material and surrounded by said oxide layer on said trench sidewalls followed by applying a RTP process in an N2 of O2/N2 ambient environment at an elevated temperature to bring an etch rate of the HDP oxide layer close to an etch rate of the oxide layer surrounding the HDP oxide layer; and dry etching back said HDP oxide layer and partially etching the oxide layer on said trench sidewalls surrounding said HDP oxide layer to expose said HDP oxide layer followed by a dry or wet-etch to obtain a desired HDP oxide layer thickness and a desired oxide layer thickness of the oxide layer on said trench sidewalls.

* * * * *